United States Patent
Inokuchi et al.

(10) Patent No.: US 8,368,203 B2
(45) Date of Patent: Feb. 5, 2013

(54) HEAT RADIATION MEMBER FOR A SEMICONDUCTOR PACKAGE WITH A POWER ELEMENT AND A CONTROL CIRCUIT

(75) Inventors: Takatoshi Inokuchi, Kariya (JP); Tadatoshi Asada, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/960,377

(22) Filed: Dec. 3, 2010

(65) Prior Publication Data

US 2011/0133320 A1 Jun. 9, 2011

(30) Foreign Application Priority Data

Dec. 4, 2009 (JP) ................................. 2009-276000

(51) Int. Cl.
*H01L 23/495* (2006.01)
(52) U.S. Cl. ........ 257/698; 257/675; 257/676; 257/693; 257/E21.51; 257/E23.051
(58) Field of Classification Search ........................ None
See application file for complete search history.

(56) References Cited

U.S. PATENT DOCUMENTS

| | | | |
|---|---|---|---|
| 6,291,880 B1 * | 9/2001 | Ogawa et al. | 257/723 |
| 6,882,042 B2 * | 4/2005 | Zhao et al. | 257/706 |
| 7,892,893 B2 | 2/2011 | Obara | |
| 2004/0089928 A1 | 5/2004 | Nakajima et al. | |
| 2004/0095730 A1 * | 5/2004 | Youm et al. | 361/718 |
| 2005/0067719 A1 * | 3/2005 | Hayashi et al. | 257/787 |
| 2005/0082690 A1 | 4/2005 | Hayashi et al. | |
| 2006/0022331 A1 * | 2/2006 | Shinohara | 257/718 |
| 2011/0108964 A1 | 5/2011 | Obara | |

FOREIGN PATENT DOCUMENTS

| | | |
|---|---|---|
| JP | 2000-183279 | 6/2000 |
| JP | 2005-217167 | 8/2005 |
| JP | 3740116 | 11/2005 |
| JP | 3846699 | 9/2006 |
| JP | 3854957 | 9/2006 |
| JP | 2008-4971 | 1/2008 |
| JP | 4146785 | 6/2008 |
| JP | 2008-243970 | 10/2008 |
| JP | 2009-277949 | 11/2009 |

OTHER PUBLICATIONS

Office Action (2 pgs.) dated Dec. 1, 2011 issued in corresponding Japanese Application No. 2009-276000 with an at least partial English-language translation thereof.

* cited by examiner

*Primary Examiner* — Calvin Lee
*Assistant Examiner* — Abul Kalam
(74) *Attorney, Agent, or Firm* — Nixon & Vanderhye P.C.

(57) ABSTRACT

A semiconductor package includes a metal plate, a power element, a lead frame having a die pad, a resin sheet having insulation properties, a control circuit that controls the power element, and a mold resin. The power element is mounted on the die pad, and the die pad is mounted on the metal plate via the resin sheet. The resin sheet is expanded including at least a lower surface of the die pad while the lower surface of the resin sheet is smaller than an surface of the metal plate, and the control circuit is arranged in a region on the metal plate, which region is other than the region where the power element is arranged.

1 Claim, 4 Drawing Sheets

HEAT RADIATION MEMBER FOR A SEMICONDUCTOR PACKAGE WITH A POWER ELEMENT AND A CONTROL CIRCUIT

CROSS-REFERENCE TO RELATED APPLICATION

This application is based on and claims the benefit of priority from earlier Japanese Patent Application No. 2009-276000 filed Dec. 4, 2009, the description of which is incorporated herein by reference.

TECHNICAL FIELD

The present disclosure relates to a semiconductor package incorporating a power element and a control circuit, and a method of manufacturing the semiconductor package.

BACKGROUND

In a known semiconductor package, an insulating sheet adhered to a copper foil of the same shape is attached to a lower surface of a die pad of a lead frame, on which a power MOSFET (metal oxide semiconductor field-effect transistor) is mounted.

In this semiconductor package, the lead frame, the power MOSFET, the insulating sheet and the copper foil are molded all together to obtain insulation properties and high heat radiation properties (e.g., see JP-B-3740116).

Also, in a known semiconductor package incorporating a power MOSFET and a control circuit, an insulating resin sheet is attached to and molded onto a lower surface of a die pad of a lead frame, on which the power MOSFET is mounted, to form a mixed layer of the resin sheet and a mold resin (e.g., see JP-B-4146785).

In a known method of manufacturing a semiconductor package, a press pin is used to press a die pad against an insulating sheet, followed by molding (e.g., see JP-B-3854957).

Also, in a known method of manufacturing a semiconductor package, a resin sheet is prepared, which is solid at normal temperature, and temporarily melted at high temperature but then completely cured.

In this method, a mold having temperature higher than the melting temperature of the resin sheet is also prepared.

Then, the resin is superheated and filled in the mold with the application of pressure to thermoset the resin sheet (e.g., see JP-A-2008-004971).

Further, a known semiconductor power module includes a heat sink provided with a resin sheet, and a lead frame having a bent portion of the same shape as that of the resin sheet (e.g., see JP-B-3846699).

Regarding the semiconductor package disclosed in JP-B-3740116, the small clearance between the metal and the mold resin raises a problem of low reliability under the condition where the semiconductor package has got wet.

Furthermore, this semiconductor package needs a large insulating sheet when a heat sink is made large in order to increase an area contacting the outside, and thus raises a problem of increasing cost.

Regarding the semiconductor package disclosed in JP-B-4146785, the control circuit is not in contact with the resin sheet and thus the temperature of the power MOSFET is unlikely to be transferred to the control circuit.

Due to the protective measure against the transfer of temperature from the power MOSFET, this semiconductor package has suffered from a problem of difficulty in sensing the temperature of the power MOSFET.

Furthermore, in this semiconductor package, a portion of the resin sheet tends to be melted, which portion is located near the boundary between the resin sheet and the mold resin.

As a result, the thickness of the resin sheet is reduced and thus the heat conductivity is lowered, leading to a problem of deteriorating cooling performance.

Regarding the method of manufacturing a semiconductor package disclosed in JP-B-3854957, the mold is required to have a press-pin structure, which raises a problem of making the manufacturing steps complicated.

In addition, each die pad in this method is required to have a pin-holding portion which allows the individual die pads to be closely located, raising a problem of deteriorating the insulation properties between the terminals.

Further, due to the provision of the pin-holding portion, the area of a die pad mounted with no element is increased, which raises a problem of increasing the size of the semiconductor package.

Regarding the method of manufacturing a semiconductor package disclosed in JP-A-2008-004971, the positioning of the resin sheet with respect to the mold is difficult.

In order to achieve good positioning, the resin sheet is required to be expanded over the entire bottom surface of the mold, or the mold is required to be provided with a positioning projection.

Further, the lead frames are likely to be pushed and displaced when a mold resin is filled in. Thus, this method of manufacturing a semiconductor package has suffered from a problem of low processability.

Regarding the semiconductor power module disclosed in JP-B-3846699, since the adhesion layer is stacked on the insulating layer, heat conductivity is problematically lowered to deteriorate cooling performance.

In addition, the number of processes will be increased, in this semiconductor power module, with the increase of the number of parts, which raises a problem of deteriorating processability.

SUMMARY

An embodiment provides a semiconductor package at low cost, which is able to enhance reliability and cooling performance, reduce size and facilitate sensing of temperature of a power element, and to provide a method of manufacturing the semiconductor package.

In a semiconductor package according to a first aspect, the semiconductor package includes a metal plate, a power element, a lead frame having a die pad, a resin sheet having insulation properties, a control circuit that controls the power element, and a mold resin that seals the metal plate except one surface, the resin sheet, the power element, and the control circuit.

The semiconductor package accommodates the power element and the control circuit therein, the power element is mounted on the die pad, and the die pad is mounted on the metal plate via the resin sheet.

The resin sheet is expanded including at least a lower surface of the die pad while the lower surface of the resin sheet is smaller than an surface of the metal plate.

The control circuit is arranged in a region on the metal plate, which region is other than the region where the power element is arranged.

Thus, the resin sheet of a minimum required area is used, even when the metal plate serving as a heat sink has a large area, to thereby reduce the cost of production. Also, use of the resin sheet smaller than the metal plate can provide a large interface between the metal plate and the mold resin, which have good adhesion properties.

Accordingly, reliability is enhanced if, for example, the semiconductor package has got wet.

Further, owing to the arrangement of the control circuit on the metal plate, the temperature of the power element can be accurately sensed through the metal plate.

Accordingly, an overheat warning for the power element can be easily given, or control at the time of overheating the power element can be facilitated.

In the semiconductor package according to a second aspect, the control circuit is arranged on the metal plate via the resin sheet.

In the semiconductor package according to a third aspect, the semiconductor package further includes a frame having a second die pad with the control circuit mounted thereon, the power element is joined onto the lead frame with solder, and the control circuit is joined onto the frame using a silver paste.

In the semiconductor package according to a fourth aspect, a pad for wire bonding is provided on the metal plate in a region not covered with the resin sheet, a ground terminal of at least one of either the power element or the control circuit is connected to the pad through a bonding wire, and the metal plate is connected to either the external housing or a heat radiation fin through electrical connecting means.

In the semiconductor package according to a fifth aspect, the metal plate has a through hole, the through hole and its peripheral region are exposed to the outside, and the electrical connecting means is formed by fixing the metal plate to the housing or the heat radiation fin by passing a screw through the through hole and tightening up the screw.

In the semiconductor package according to a sixth aspect, the resin sheet remains without being mixed with the mold resin, and an interface is provided between the resin sheet and the mold resin.

In the method of manufacturing the semiconductor package according to a seventh aspect, the method includes steps of mounting elements including the power element and the control circuit on the die pad using mounting means including at least wire bonding, arranging the resin sheet on the metal plate, adhering the die pad on which the elements are mounted onto the resin sheet that is arranged on the metal plate, setting the metal plate on which the die pad is mounted via the resin sheet to a mold, and filling a mold resin in the mold, followed by heating, application of pressure and curing.

In the method of manufacturing the semiconductor package according to an eighth aspect, the resin sheet has adhesive properties.

DETAILED DESCRIPTION OF THE PREFERRED EMBODIMENTS

Figure 1:
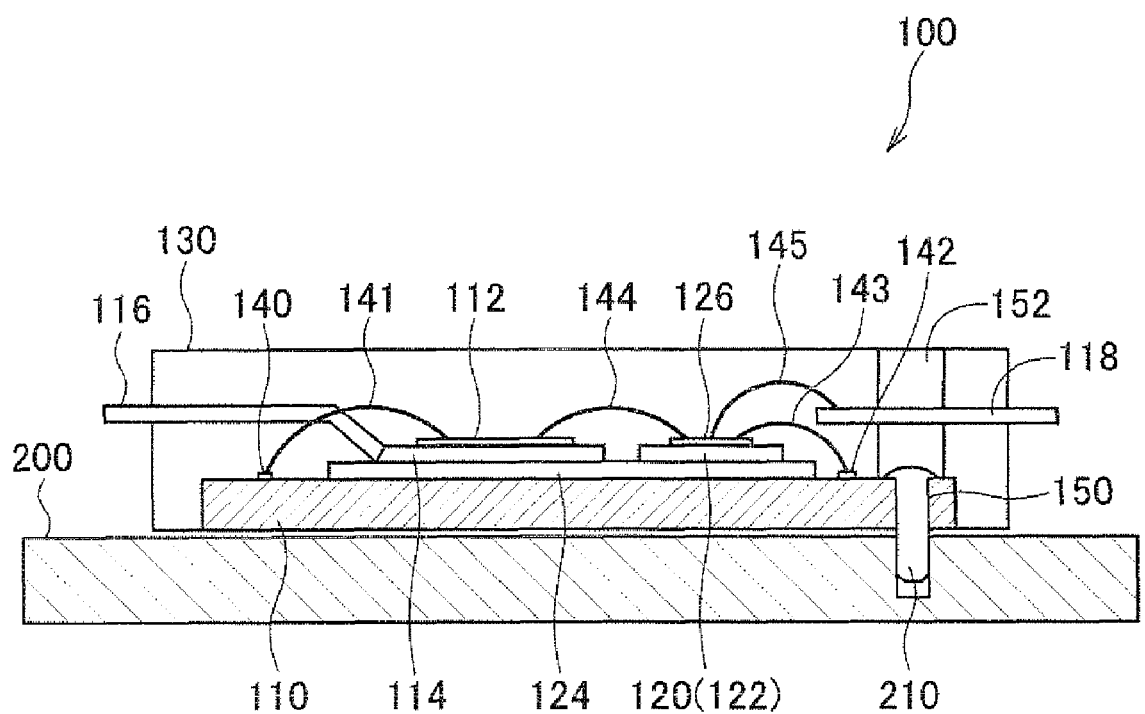
FIG. 1 is a cross-sectional view illustrating the configuration of a semiconductor package according to an embodiment of the present embodiment.

With reference to the drawings, hereinafter will be described an embodiment of the present disclosure. FIG. 1 is a dross-sectional view illustrating the configuration of a semiconductor package 100 according to the present embodiment.

As shown in FIG. 1, the semiconductor package 100 of the present embodiment includes a metal plate 110, a power element 112, lead frames 116 and 118, a die pad frame 122, a resin sheet 124, a control circuit 126 and a mold resin 130.

The metal plate 110 functions as a heat sink. In a state of being resin-molded, only one surface (lower surface) of the metal plate 110 is exposed to the outside of the semiconductor package 100.

The power element 112 is an element, such as a power MOSFET (metal oxide semiconductor field-effect transistor), with a calorific power larger than that of the control circuit 126 or of other elements.

The lead frame 116 has a portion that includes a die pad 114 and another portion that serves as a lead terminal for establishing electrical connection with an external circuit (not shown).

The lead frame 118 does not have any portion that includes a die pad but serves as a lead terminal for establishing electrical connection with the external circuit. The die pad frame 122 functions in its entirety as a die pad 120.

The resin sheet 124 has insulation properties and adhesion properties. The resin sheet 124 is melted during heating and pressurization in forming the mold resin 130 but remains without being mixed with the mold resin 130. Accordingly, an interface is provided between the resin sheet 124 and the mold resin 130.

The control circuit 126 is connected to the power element 112 to drive the power element 112 and sense the temperature around the power element 112, while performing various other processes.

The power element 112 of the present embodiment is mounted on the die pad 114. The die pad 114 is mounted on the metal plate 110 via the resin sheet 124. The power element 112 is joined onto the die pad 114 with solder (soldered onto the die pad 114).

The resin sheet 124 has good heat conductivity (specifically has a heat conductivity of 7.5 W/(m·K) or more), and thus is able to efficiently transfer the heat generated by the power element 112 to the metal plate 110.

The resin sheet 124 is expanded to cover at least the lower surfaces of the die pads 114 and 120. The lower surface of the resin sheet 124 is smaller than the upper surface of the metal plate 110.

Accordingly, a part of the upper surface of the metal plate 110 is not covered with the resin sheet 124 but exposed around the resin sheet 124.

The control circuit 126 is mounted on the die pad 120 which is mounted on the metal plate 110 via the resin sheet 124. The control circuit 126 is joined onto the die pad 120 using a silver paste.

Thus, the control circuit 126 is arranged in a region on the metal plate 110, which region is other than the region where the power element 112 is arranged.

A region in the upper surface of the metal plate 110, which is not covered with the resin sheet 124 (exposed region) is provided with pads 140 and 142. The pad 140 is connected to a ground terminal of the power element 112 through a bonding wire 141.

The pad 142 is connected to a ground terminal of the control circuit 126 through a bonding wire 143. The power element 112 and the control circuit 126 are connected through a bonding wire 144, while the control circuit 126 and the lead frame 118 are connected through a bonding wire 145.

As mentioned above, the lower surface of the metal plate 110 is exposed to the outside. Meanwhile, the metal plate 110 is connected to an external housing or a heat radiation fin 200 through electrical connecting means.

In the example shown in FIG. 1, a screw 210 is used as the electrical connecting means. For example, the metal plate 110 has a through hole 150.

The through hole 150 and its peripheral region are exposed to the outside via an opening 152 formed in the mold resin 130.

The screw 210 is passed through the through hole 150 making use of the opening 152 and tightened up to have the metal plate 110 fixed to the housing or the heat radiation fin 200.

The semiconductor package 100 of the present embodiment has a structure as described so far. Hereinafter, steps of manufacturing the structure are described.

FIGS. 2A to 2E are diagrams illustrating the steps of manufacturing the semiconductor package 100. As shown in FIGS. 2A to 2E, the semiconductor package 100 is manufactured through the following steps.

(First Step)

Figure 2A:
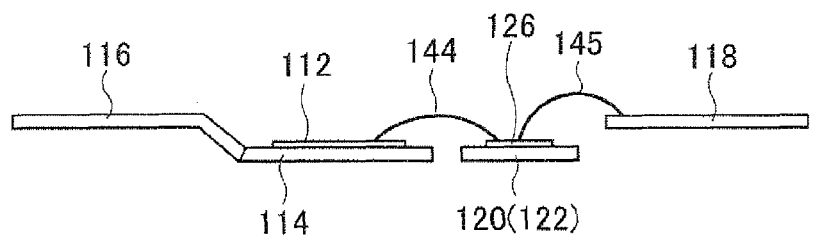
FIGS. 2A to 2E are diagrams each illustrating steps of manufacturing the semiconductor package.

Elements, such as the power element 112 and the control circuit 126, are mounted on the die pad 114 of the lead frame 116 and the die pad 120 of the die pad frame 122, using such means as wire bonding (FIG. 2A).

(Second Step)

Figure 2B:
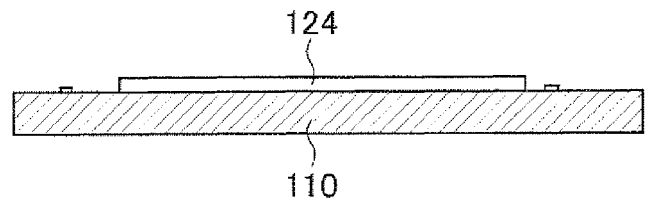

The resin sheet 124 is arranged on the metal plate 110 (FIG. 2B).

(Third Step)

Figure 2C:
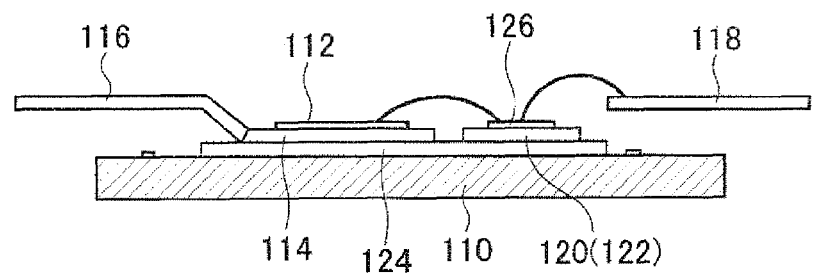

The die pads 114 and 120 on which the power element 112, the control circuit 126 and the like are mounted are adhered onto the resin sheet 124 which is arranged on the metal plate 110 (FIG. 2C).

(Fourth Step)

Figure 2D:
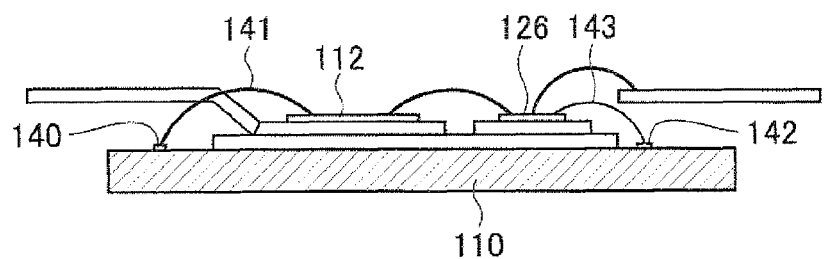

Wire bonding is performed to establish connection between the pad 140 on the metal plate 110 and the power element 112, and between the pad 142 on the metal plate 110 and the control circuit 126 (FIG. 2D).

(Fifth Step)

Figure 2E:
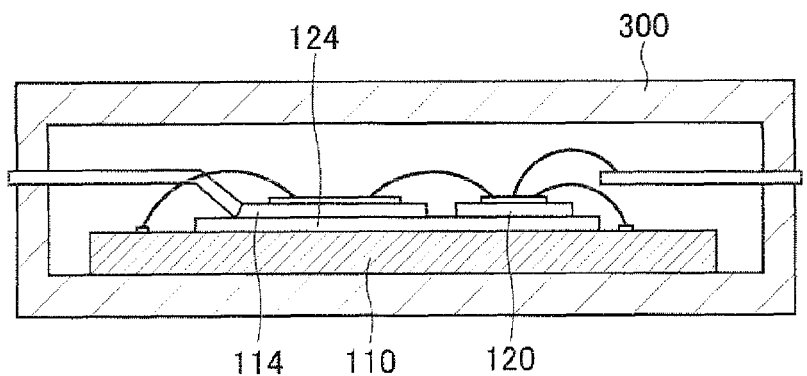

The metal plate 110 on which the die pads 114 and 120 are mounted via the resin sheet 124 is set to a mold 300 (FIG. 2E).

(Sixth Step)

A mold resin is filled in the mold 300, followed by heating, application of pressure and curing (not shown).

In this way, the semiconductor package 100 of the present embodiment can reduce cost by using the requisite minimum resin sheet 124, even when the area of the metal plate 110 serving as a heat sink is increased.

Also, use of a resin sheet 124 smaller than the metal plate 110 can increase the interface between the metal plate 110 and the mold resin 130, which have good adhesive properties.

Accordingly, reliability is enhanced when the semiconductor package 100 has got wet.

Further, the arrangement of the control circuit 126 on the metal plate 110 can enhance the accuracy of sensing the temperature of the power element 112 via the metal plate 110 (if the control circuit 126 includes a temperature sensing element and a circuit therefor).

Accordingly, an overheat warning for the power element 112 can be easily given, or the control at the time of overheating the power element 112 can be facilitated.

Also, since the control circuit 126 is arranged on the metal plate 110 via the resin sheet 124, the temperature of the power element 112 is transferred straight to the control circuit 126 via the resin sheet 124 having high heat conductivity without being transferred through the metal plate 110.

Accordingly, the accuracy is further enhanced in sensing the temperature of the power element 112. Also, since the control circuit 126 is electrically insulated from the metal plate 110 by the intervention of the resin sheet 124, reliability is enhanced under the condition where a surge is applied to the metal plate 110.

Further, soldering of the power element 112 to the lead frame 116 (die pad 114) can ensure good heat radiation properties of the power element 112. Also, since no soldering is performed for the control circuit 126, the life of the control circuit 126 is elongated which would otherwise have been shortened by the application of thermal shock stress.

In this regard, surface treatment for soldering is no longer required to be given to the rear surface of the control circuit 126 (the side opposed to the die pad frame 122), and thus the number of processing steps to be taken is reduced.

As described above, the metal plate 110 is provided thereon with the resin sheet 124, and the lead frame 116 (or the die pad frame 122) is arranged on the resin sheet 124. Further, the power element 112 and the control circuit 126 are joined onto the top of the lead frame 116 (or the die pad frame 122).

Accordingly, substantially an even level is ensured between the upper surfaces of the power element 112 and the control circuit 126 to thereby facilitate wire bonding.

In other words, a processing step of adjustment or the like can be omitted to enhance processability, which adjustment would have otherwise been necessary if the level is different between these surfaces.

Moreover, use of the metal plate 110 as a ground terminal can eliminate separate provision of a lead frame as a ground terminal to thereby simplify the structure.

Further, since the semiconductor package 100 is fixed to the housing or the heat radiation fin 200 by tightening up the screw 210, fixation is reliably performed under high vibration conditions.

At the same time with the fixation, a conduction path is ensured between an external ground terminal and the semiconductor package 100, and thus wiring for the ground terminal is no longer necessary.

Also, use of an unmelting resin sheet 124 that can provide an interface ensures stable heat conductivity via the resin sheet 124.

According to the manufacturing steps for the semiconductor package of the present embodiment, the die pads 114 and 120 are already fixed to the metal plate 110 before performing resin-molding.

Accordingly, at the stage of setting the die pads 114 and 120 and the lead frame 118 to the mold 300, positioning of the metal plate 110 can be simultaneously performed.

Also, displacement of the die pads 114 and 120 is prevented when the mold resin is filled in the mold 300, which displacement would have otherwise been caused with the die pads 114 and 120 being pushed by the flowing mold resin.

Since the die pads 114 and 120 are fixed to the metal plate 110, it is not necessary to provide the mold 300 with a press-pin structure for fixing the die pads 114 and 120.

Further, since the die pads 114 and 120 are also no longer required to have spaces for press pins, the size of the die pads 114 and 120 is made small, while the distance therebetween is made large.

In addition, use of the resin sheet 124 having adhesive properties can simplify the processing step in arranging the resin sheet 124 on the metal plate 110 or arranging the die pad 114, for example, on the resin sheet 124.

Figure 3:
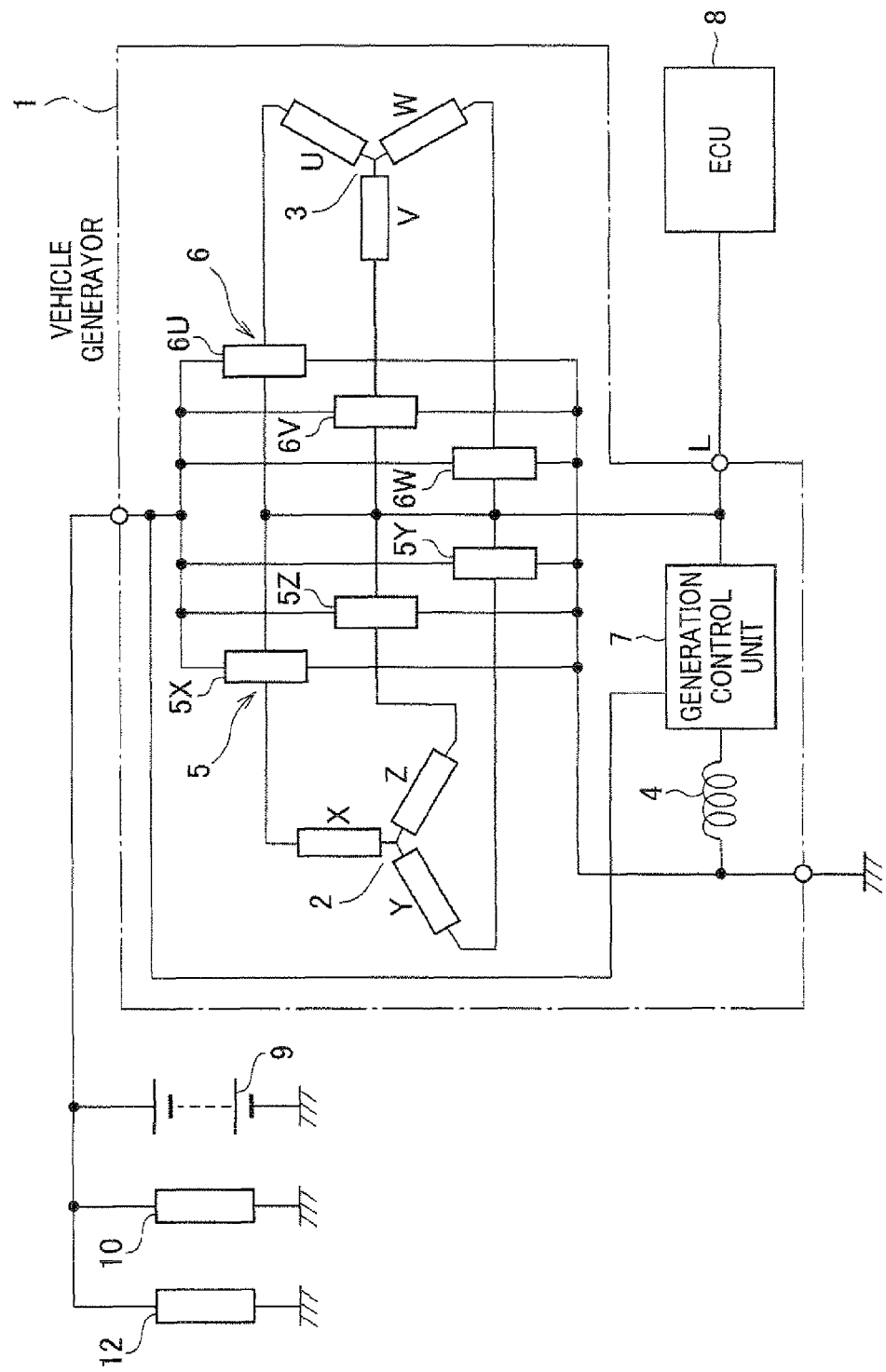
FIG. 3 is a circuit diagram illustrating the configuration of a vehicle generator, at a portion of which the semiconductor package is used.
Figure 4:
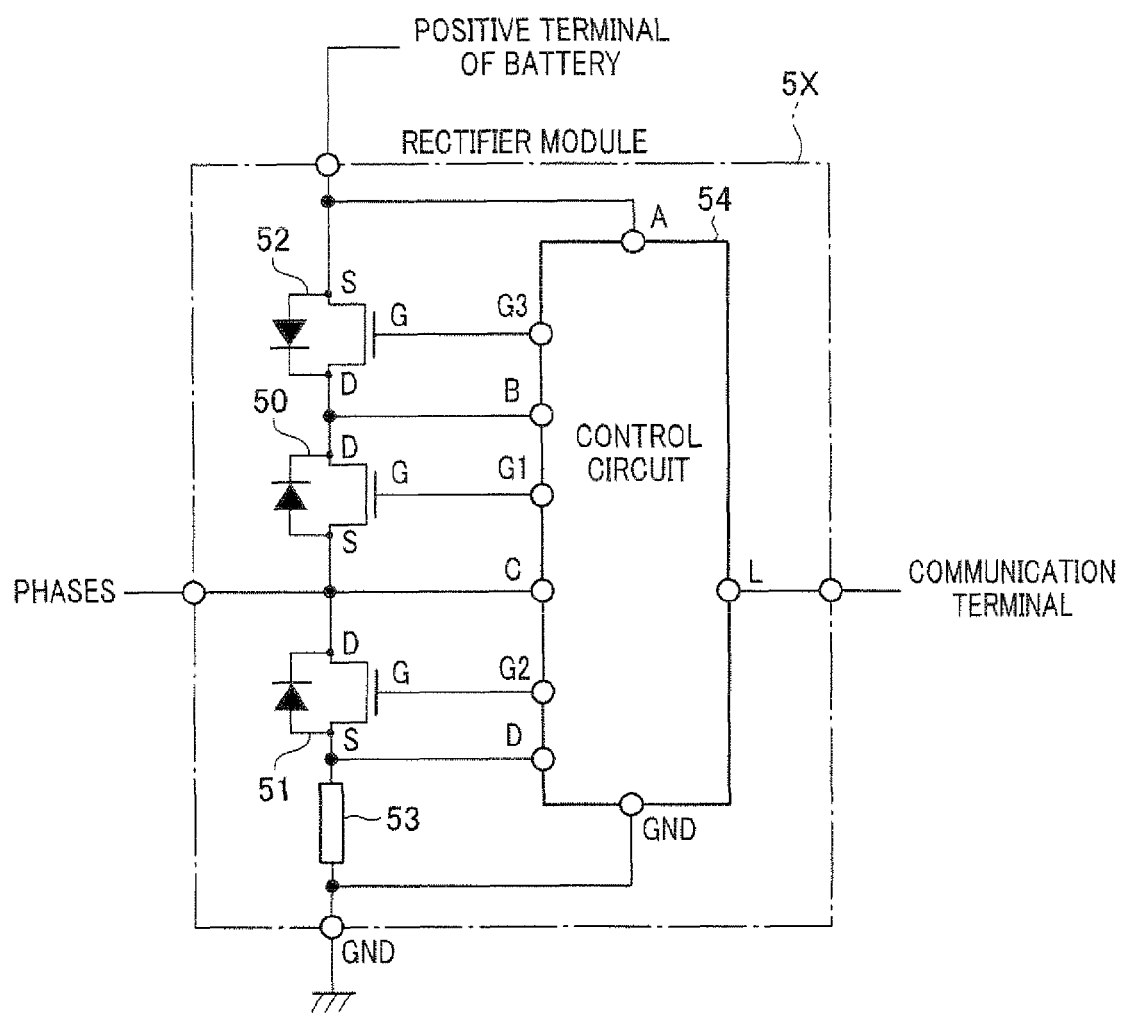
FIG. 4 is a circuit diagram illustrating the configuration of a rectifier module used in the vehicle generator.

Referring now to FIGS. 3 and 4, hereinafter is described a preferred application of the semiconductor package 100 described above.

FIG. 3 is a block diagram illustrating the configuration of a vehicle generator 1, in a portion of which the semiconductor package 100 is used. The vehicle generator 1 shown in FIG. 3 includes two stator windings 2 and 3, a field winding 4, two rectifier module groups 5 and 6, and a generation control unit 7.

The rectifier module group 5 is connected to the stator winding 2 to configure, on the whole, a three-phase full-wave rectifying circuit.

The rectifier module group 5 includes rectifier modules 5X, 5Y and 5Z of the number corresponding to the number of phases (three, in the case of a three-phase winding) of the stator winding 2.

The rectifier module 5X is connected to an X-phase winding included in the stator winding 2. The rectifier module 5Y is connected to a Y-phase winding included in the stator winding 2. The rectifier module 5Z is connected to a Z-phase winding included in the stator winding 2.

The rectifier module group 6 is connected to the stator winding 3 to configure, on the whole, a three-phase full-wave rectifying circuit.

The rectifier module group 6 includes rectifier modules 6U, 6V and 6W of the number corresponding to the number of phases (three, in the case of a three-phase winding) of the stator winding 3.

The rectifier module 6U is connected to a U-phase winding included in the stator winding 3. The rectifier module 6V is connected to a V-phase winding included in the stator winding 3. The rectifier module 6W is connected to a W-phase winding included in the stator winding 3.

The generation control unit 7 controls excitation current passed through the field winding 4 to control the generated voltage of the vehicle generator 1 (output voltage of the individual rectifier modules).

The generation control unit 7 is connected to an ECU 8 (external control unit) via a communication terminal and a communication line.

Thus, the generation control unit 7 performs two-way serial communication (e.g., communication using a LIN (local interconnect network) protocol) with the ECU 8 to transmit or receive messages.

In the vehicle generator 1 configured as described above, each of the modules, such as the rectifier module 5X, is realized by the semiconductor package 100.

FIG. 4 is a block diagram illustrating the configuration of the rectifier module 5X. Each of other rectifier modules 5Y, 5Z, 6U, 6V and 6W also has the same configuration.

As shown in FIG. 4, the rectifier module 5X includes three MOS (metal-oxide semiconductor) transistors 50, 51 and 52, a current sensing element 53 and a control circuit 54.

The MOS transistor 50 that is a high-side switch element has a source connected to the X-phase winding of the stator winding 2, and a drain connected to the positive terminal of a battery 9 via the MOS transistor 52.

The MOS transistor 51 that is a low-side switch element has a drain connected to the X-phase winding and a source connected to the negative terminal (ground) of the battery 9 via the current sensing element 53.

The MOS transistor 52 that is a switch element disposed between the high-side MOS transistor 50 and the positive terminal of the battery 9 has a drain connected to a drain side of the MOS transistor 50.

The MOS transistor 52 is used for protecting against reverse connection of the battery and for suppressing load-dump surge.

In the case of a configuration including only the MOS transistors 50 and 51, reverse connection of the battery 9 will allow high current to flow through the body diodes of the MOS transistors 50 and 51.

However, if the configuration also includes the MOS transistor 52 for protection, the high current that would flow through the body diodes of the MOS transistor 50 and 51 due to the reverse connection is interrupted by turning off the MOS transistor 52.

When the battery 9 connected to the vehicle generator 1 comes off, a large load-dump surge will be caused at the X-phase winding of the stator winding 2.

In such a case, when the MOS transistor 52 is turned off, a large surge voltage is prevented from being applied such as to electrical loads 10 and 12 from the vehicle generator 1.

The MOS transistors 50, 51 and 52 each correspond to the power element 112 of the semiconductor package 100, and the control circuit 54 corresponds to the control circuit 126 of the semiconductor package 100.

The present invention is not intended to be limited to the embodiment described above, but may be implemented with various modifications within a scope not departing from the spirit of the present invention.

For example, in the embodiment described above, the semiconductor package 100 has been applied such as to the rectifier module 5X.

As a matter of fact, however, the generation control unit 7 also includes a power element that interrupts excitation current flowing through the field winding 4, and a control circuit that controls the timing, for example, of the interruption.

Accordingly, the generation control unit 7 may also be realized using the structure of the semiconductor package 100.

Further, the application of the semiconductor package 100 is not limited to a vehicle generator but may be realized in any other apparatus if only the apparatus includes a power element and a control circuit.

As described above, according to the present invention, the resin sheet 124 of a minimum required area is used, even when the metal plate 110 serving as a heat sink has a large area, to thereby reduce the cost of production.

Also, use of the resin sheet 124 smaller than the metal plate 110 can provide a large interface between the metal plate 110 and the mold resin 130, which have good adhesive properties.

Accordingly, reliability is enhanced under the condition where, for example, the semiconductor package 100 has got wet. Further, owing to the arrangement of the control circuit 126 on the metal plate 110, the temperature of the power element 112 can be accurately sensed through the metal plate 110.

Accordingly, an overheat warning for the power element 112 can be easily given, or control at the time of overheating the power element 112 can be facilitated.

What is claimed is:
1. A semiconductor package comprising:
a metal plate,
a power element,
a lead frame having a die pad,
a resin sheet having insulation properties,
a control circuit that controls the power element, and
a mold resin that seals the metal plate except one surface, the resin sheet, the power element, and the control circuit, wherein:
the semiconductor package accommodates the power element and the control circuit therein,
the power element is mounted on the die pad,
the die pad is mounted on the metal plate via the resin sheet,
the resin sheet is expanded to cover at least a lower surface of the die pad while the lower surface of the resin sheet is smaller than an surface of the metal plate, the control circuit is arranged in a region on the metal plate, which region is other than the region where the power element is arranged, and the control circuit is arranged on the metal plate via the resin sheet, the semiconductor package further comprises a frame having a second die pad with the control circuit mounted thereon, the power element is joined onto the lead frame with solder, the control circuit is joined onto the frame using a silver paste, a pad for wire bonding is provided on the metal plate in a region not covered with the resin sheet, a ground terminal of at least one of either the power element or the control circuit is connected to the pad through a bonding wire, the metal plate is connected to either an external housing or the heat radiation fin through an electrical connecting device, the metal plate has a through hole, the through hole and its peripheral region are exposed to the outside, and the electrical connecting device is formed by fixing the metal plate to the housing or the heat radiation fin by passing a screw through the through hole and tightening up the screw.

* * * * *